United States Patent
Hornung

[11] Patent Number: 6,104,196
[45] Date of Patent: Aug. 15, 2000

[54] CRUISE CONTROL TESTER

[76] Inventor: Thomas F. Hornung, 144 Wimbleton Dr., Birmingham, Mich. 48009

[21] Appl. No.: 09/032,287

[22] Filed: Feb. 26, 1998

Related U.S. Application Data

[60] Provisional application No. 60/039,404, Feb. 28, 1997.

[51] Int. Cl.[7] .......................... G01R 31/00; H01H 31/12; G08B 21/00; B60Q 1/00
[52] U.S. Cl. .......................... 324/503; 324/555; 340/653; 340/654; 340/438
[58] Field of Search ..................................... 324/503, 555, 324/556, 383; 340/652, 653, 654, 438; 73/1.37; 180/177, 179; 701/93, 97

[56] References Cited

U.S. PATENT DOCUMENTS

| | | | |
|---|---|---|---|
| 4,565,963 | 1/1986 | Shaw | 324/503 |
| 4,764,727 | 8/1988 | McConchie, Sr. | 324/503 |
| 4,884,033 | 11/1989 | McConchie, Sr. | 324/503 |
| 5,027,640 | 7/1991 | Hinckley et al. | 324/503 |
| 5,040,407 | 8/1991 | Hinckley et al. | 324/503 |

*Primary Examiner*—Josie Ballato
*Assistant Examiner*—Jermele M. Hollington
*Attorney, Agent, or Firm*—Reising, Ethington, Barnes, Kisselle, Learman & McCulloch, P.C.

[57] ABSTRACT

A tester is disclosed for any one of three different types of cruise control systems on a vehicle, each of which has a cruise engage signal conductor which is tested for circuit continuity. The continuity testing circuit includes a battery, light emitting diode (LED) and a transistor with its base connected through a bias resistor to a connector element which is connected to the cruise engage signal conductor for testing its continuity. The circuit continuity is indicated by turn-on of the LED for two types of cruise control systems and by failure to turn-on the LED for the third type of cruise control system.

1 Claim, 1 Drawing Sheet

CRUISE CONTROL TESTER

This application claims the benefit of U.S. provisional patent application serial no. 60/039,404 filed on Feb. 28, 1997.

FIELD OF THE INVENTION

This invention relates to testers and, more particularly, it relates to an improved tester for cruise control systems for automotive vehicles.

BACKGROUND OF THE INVENTION

The requirements for the capabilities of cruise control testers have changed over a period of time due to the changes made by vehicle manufacturers in the cruise control system itself and its adaptation to various models of vehicles. It is not cost effective to produce a new tester each time a change requirement occurs. Accordingly, it is desirable to provide a cruise control tester which is adaptable to modification for changing its capabilities to meet new requirements.

A particular cruise control tester known as Model CTI-232 has been marketed for several years by Concept Technology, Inc. of Birmingham, Mich. This tester functions on General Motors cruise control systems on 1982 to 1997 model vehicles and beyond. This tester will test the new Electromotor II, Electromotor I, Custom Cruise III (high frequency) Systems. With adapters, it will test the Custom Cruise Control III (low frequency) Systems. The tester uses two sets of connectors which allows the tester to be connected between the vehicle harness and the cruise control module. This tester is actually two testers in one; the first part tests the vehicle harness while the second part tests the control module. It is a hand-held tester and will conduct a complete test of components on the different cruise control systems without starting the engine.

The "Cruise Lamp" on the prior art tester originally tested the "Cruise Engage" lamp on the vehicle instrument panel. If the vehicle used a "Cruise Engage" lamp the tester would test it for continuity. If the vehicle did not use a "Cruise Engage" lamp, the tester "Cruise Engage" lamp would not light. Therefore only two scenarios existed, vehicles with and vehicles without "Cruise Engage" lamps on the instrument panel. Now a third scenario exists, that is a vehicle having a "Cruise Engage" control wire connected to the vehicle Powertrain Control Module (PCM). The PCM controls all the drive train functions of the engine, transmission and any other computers that might be used in the drive train configuration. The PCM also communicates with the instrument panel electronics to report road speed and other engine data. It is through this wire that the cruise control module tells the PCM that the cruise system is "Engaged". The input impedance characteristics of this PCM input are not compatible with the tester input. When the tester is connected to a vehicle where the "Cruise Engage" wire is connected to the PCM, the "Cruise Engage" lamp lights only very dimly which causes misdiagnosis by the technician.

This invention modifies the well known CTI 232 tester to allow it to function on the latest versions of the General Motors Delphi Cruise Control Systems.

A general object of this invention is to overcome certain disadvantages of the prior art and to provide an improved cruise control tester with the capability of testing new model cruise control system on new vehicle models.

A complete understanding of this invention may be obtained from the detailed description that follows taken with the accompanying drawings.

DESCRIPTION OF THE DRAWINGS

The single FIGURE of the drawing is a block diagram showing the tester of this invention and its connections for testing a cruise control system on a vehicle.

BEST MODE FOR CARRYING OUT THE INVENTION

Figure 1:
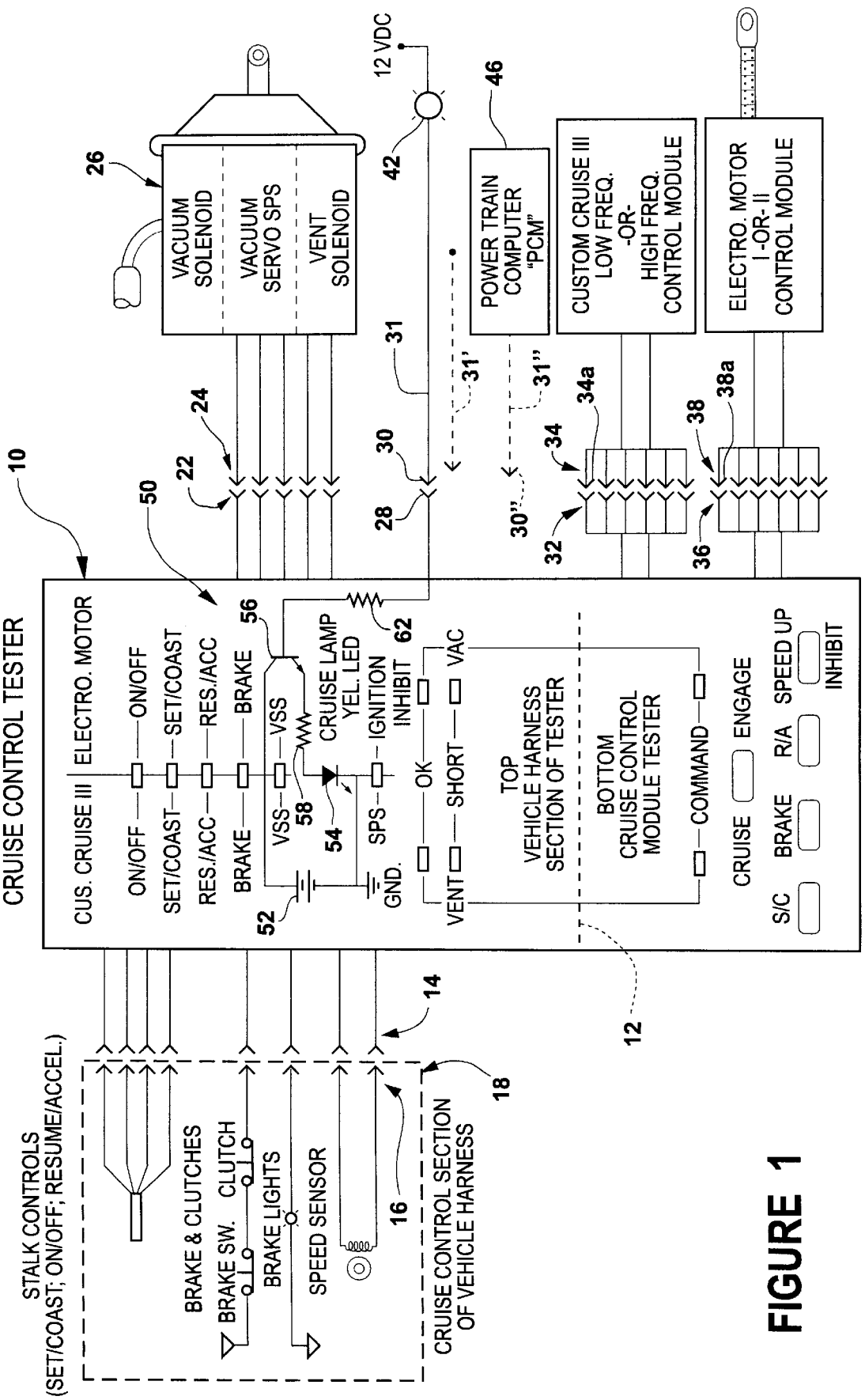

Referring now to the drawings, the cruise control tester 10 is an improvement of the CTI Model 232 prior art tester identified above. The prior art tester is well-known to those skilled in the art and is described in the instruction manual "AC Cruise Control Tester Model 232" published by Concept Technology, Inc. The tester 10 of this invention is depicted in the drawing which shows the front panel of the tester with a schematic circuit diagram thereon. The top section of the tester (above the dashed line 12) represents the vehicle harness tester. The bottom section (below the dash line 12) represents the cruise control module tester. In the vehicle harness tester section, the small rectangles represent indicator lights to indicate the status or data corresponding to the component or operation identified by the label associated with the indicator light. In the cruise control module tester, the small rectangles represent indicator lights for the data or status corresponding to the component or operation identified by the adjacent labels. The larger rectangles at the lower edge of the panel represent push buttons corresponding to the functions indicated by the associated labels.

The cruise control tester 10 is provided with a set of connectors 14 which are adapted to be connected with a mating set of connectors 16 of the vehicle wiring harness of the cruise control components which are identified within the dashed line box 18. The cruise control tester 10 is also provided with a set of connector elements 22 which are adapted to be connected with a mating set of connector elements 24 on the vacuum servo 26 of the cruise control system. The tester also includes a set of connector elements 32 which mate with a set of connector elements 34 of a Custom Cruise III module, either high frequency or low frequency. The tester also includes a set of connector elements 36 which are adapted to mate with a set of connector elements 38 of either the Electromotor I or Electromotor II control module.

The tester is also provided with a connector element 28 adapted to be connected with a connector element 30 of a cruise engage signal conductor 31 or with connector element 30' of a cruise engage signal conductor 31' or with connector element 30" of a cruise engage signal conductor 31" which will be described below.

The drawing shows three different scenarios in which the tester 10 may be operated. The first scenario is a vehicle with a cruise control system having a cruise engage lamp 42 on the instrument panel as shown by the cruise engage conductor wire 31 connected to the lamp 42. The second scenario is a vehicle with a cruise control system in which there is no cruise engage lamp as shown in the drawings by the dashed line conductor 31' which is an unterminated wire and an open circuit connection to the connector element 28. The third scenario is a vehicle with a cruise control system having a power train computer (PCM) connected through the dashed line conductor 31" to the connector element 28.

In accordance with the invention, a continuity testing circuit is provided to cause the cruise lamp 54 on the tester to be fully illuminated when there is circuit continuity of the cruise engage control conductor when it is connected with an operative cruise engage lamp 42 on the vehicle instrument panel or with the vehicle power train control module.

When the tester 10 is connected with the vehicle harness of the vehicle and the cruise control module of the vehicle for conducting a test, the connectors are engaged as indicated in the drawing. To make this connection, the connector element 30 for the cruise engage signal conductor 31 will be disconnected from its mating connector in the vehicle (for example connector element 34a of a Custom Cruise III Cruise Control) and reconnected to connector element 28. For a different vehicle connector element 30 may, for example, be disconnected from the connector element 38a and reconnected to connector element 28 for a vehicle having an Electromotor I control module. For a vehicle which does not have cruise engage lamp 42 the connector element 30' is disconnected from the connector element 34a and reconnected to the connector element 28. For testing the continuity of the cruise control engage signal conductor 31" in a vehicle having a power train computer (PCM), the connector element 30' is disconnected from the connector element 38a, for example, where the vehicle has Electromotor I Cruise Control. For testing the continuity of the cruise engage signal conductor 31 in a vehicle having a cruise engage lamp 42, the connector element 30 is disconnected from the connector element 34a and reconnected to the connector element 28 of the continuity testing circuit 50.

The continuity testing circuit 50 comprises an amplifier including a transistor 56 coupled with the cruise lamp which is a light emitting diode (LED) 54 on the panel of the tester. The transistor 56 has its base connected through a bias resistor 62 to the connector element 28. The collector of the transistor is connected to the positive terminal of the tester battery 52 which has its negative terminal connected to ground. The emitter of the transistor is connected through a current limiting resistor 58 to the anode of the light emitting diode 54. The cathode of the LED is connected to ground.

In operation of the continuity testing circuit, when connector element 28 is connected with connector element 30, the continuity of the cruise engage signal conductor 31 and the circuit of the cruise engage lamp 42 will be tested. This is the first scenario referred to above. If the circuit under test has no discontinuity, a positive voltage will be applied to the base of transistor 56 from the vehicle battery through the circuit under test. Accordingly, transistor 56 will be turned on and current will flow from the battery 52 through the transistor and the LED 54 to ground providing full illumination of the LED. If the circuit under test has a discontinuity the transistor 56 will not be turned on and the LED will not be turned on.

When the connector element 28 is connected with connector element 30' in a vehicle which has no cruise engage lamp (the second scenario), the transistor 56 will not be turned on and the LED 54 will not be turned on. This is an ambiguous indication because the same indication would be obtained in the first scenario with a cruise engage lamp which has burned out or a broken cruise engage signal conductor. In a test where the LED does not turn on, the technician using the tester must check the vehicle or the vehicle maintenance manual to determine whether it is a vehicle without a cruise engage lamp. This will resolve the ambiguity so the technician will know whether the discontinuity indication is a result of a defect in the circuit under test or is due to the fact that the vehicle has no cruise engage lamp.

When the connector element 28 is connected with a connector element 30" in a vehicle which has a power train computer, the circuit under test will be that of the cruise engage signal conductor 31". The power train computer includes a pull-up resistor which holds the input pin at logic high in normal condition. If the circuit under test has no discontinuity, a positive voltage will be applied to the base of transistor 56 and the transistor will be turned on. This circuit connection between the tester and the power train computer will provide a proper impedance match so that the current flow through the transistor to the LED 54 will provide full illumination of the LED.

Although the description of this invention has been given with reference to a particular embodiment, it is not to be construed in a limiting sense. Many variations and modifications will now occur to those skilled in the art.

What is claimed is:

1. A tester for testing a cruise control system on a vehicle, said cruise control system being of any one of three different types of which all three types have a control module which produces a cruise engage signal, and a cruise engage signal conductor, wherein, in said first type said cruise engage conductor is coupled with a cruise engage lamp on said vehicle which is coupled with the positive terminal of the vehicle battery, in said second type there is no cruise engage lamp on said vehicle and in said third type said cruise engage conductor is coupled with a power train computer module on said vehicle, and wherein each type there is a disconnectible connector having first and second connector elements which are manually connectable and disconnectable from each other, said first connector element being electrically connected to said control module and said second connector element being electrically connected to said cruise engage signal conductor, said tester having a continuity testing circuit for testing the electrical continuity of said cruise engage signal conductor, said continuity testing circuit comprising:
a third connector element,
a tester battery,
a light emitting diode having its cathode coupled with the negative terminal of the tester battery,
a transistor having a base, an emitter and a collector, said emitter being coupled with the anode of the light emitting through a current limiting resistor, said collector being coupled to the positive terminal of the tester battery, and said base being coupled through a bias resistor to said third connector element, which is manually connectable to and disconnectible from the second connector element,
whereby the continuity testing circuit may be connected to said cruise engage signal conductor to test for electrical continuity,
and whereby the light emitting diode will be turned on to indicate continuity of the cruise engage signal conductor when the cruise control system is of the first type and whereby the light emitting diode will be turned on to indicate continuity of the cruise engage signal conductor when the cruise control system is of the third type, and whereby a cruise control system of the second type will be ineffective to turn on the light emitting diode.

* * * * *